United States Patent [19]

Sansregret

[11] 4,242,374
[45] Dec. 30, 1980

[54] PROCESS FOR THIN FILM DEPOSITION OF METAL AND MIXED METAL CHALCOGENIDES DISPLAYING SEMI-CONDUCTOR PROPERTIES

[75] Inventor: Joseph L. Sansregret, Fords, N.J.

[73] Assignee: Exxon Research & Engineering Co., Florham Park, N.J.

[21] Appl. No.: 31,421

[22] Filed: Apr. 19, 1979

[51] Int. Cl.$^3$ .............................................. H01L 31/18
[52] U.S. Cl. ........................................ 427/76; 29/572; 427/74; 427/87; 427/110; 427/226; 427/314; 427/343; 427/160; 427/421; 427/427
[58] Field of Search ................. 427/74, 87, 110, 226, 427/399, 76, 314, 343, 427, 421, 160; 148/6.3; 29/572

[56] References Cited

U.S. PATENT DOCUMENTS

| | | |
|---|---|---|
| 3,081,200 | 3/1963 | Tompkins ............................. 427/74 |
| 3,451,845 | 6/1969 | Schüler .................................. 427/87 |
| 3,657,006 | 4/1972 | Fisher et al. .......................... 427/76 |
| 3,840,389 | 10/1974 | Kobylinski . |
| 3,920,860 | 11/1975 | Freller .................................... 427/87 |
| 3,984,591 | 10/1976 | Plumat et al. ....................... 427/427 |
| 4,095,004 | 6/1978 | Fraas et al. ............................ 427/74 |
| 4,095,006 | 6/1978 | Jordan et al. ....................... 427/427 |

FOREIGN PATENT DOCUMENTS 2136202  2/1973 Fed. Rep. of Germany ............ 427/74
842628   7/1960 United Kingdom .................... 427/110

OTHER PUBLICATIONS

The Condensed Chemical Dictionary, 8th ed., Van Nostrand Reinhold Co., p. 882, ©1971.
Sathaye et al., "Studies on Thin Films of Cadmium Sulfide Prepared by a Chemical Deposition Method," Thin Solid Films, 37, (1976), pp. 15-23.
Hottel et al. "Properties of a Copper Oxide–Aluminum Selective Black Surface Absorber of Solar Energy" Solar Energy, 3, No. 3, pp. 10-15 (1959).

Primary Examiner—John D. Smith
Attorney, Agent, or Firm—Paul E. Purwin

[57] ABSTRACT

A low cost chemical spray deposition of metal and mixed metal chalcogenides is accomplished by spray depositing an oxide film from a mixture of a salt of the metal in solution with a water soluble hydrocarbon and water solvent. This oxide film is subjected to a heat treatment in the presence of a chalcogenide gas to induce an ion exchange process transforming the metal oxide or mixed metal oxide into the chalcogenide films of the present invention.

The deposition process is used to provide efficient selective absorbing surfaces for a solar thermal energy converter. The process may further be employed to produce a thin film photovoltaic device for converting light energy into electricity.

20 Claims, No Drawings

PROCESS FOR THIN FILM DEPOSITION OF METAL AND MIXED METAL CHALCOGENIDES DISPLAYING SEMI-CONDUCTOR PROPERTIES

BACKGROUND OF THE INVENTION

The present invention relates to thin film transition metal chalcogenides and in particular to a chemical spray deposition process employed in conjunction with a thermal ion exchange process for producing metal and mixed metal chalcogenides.

Thin film technology plays numerous and increasingly important roles in solar energy conversion. Materials in thin film form are utilized in solar photovoltaic applications, such as cadmium sulfide-copper sulfide solar cells. Thin film materials are also utilized to provide efficient solar energy absorbers for solar thermal energy conversion systems. Thin film technology offers significant reductions in the amounts of raw materials necessary to fabricate these devices. Thin film solar energy devices are acclaimed by those in the art to be the most promising of the numerous solar energy devices. Conventionally, these films are produced by high vacuum process such as thermal evaporation and sputtering. These conventional techniques are prohibitively expensive for large area thin film applications. The cost of producing large area thin films by these methods has been a principal impediment in the development of solar energy as a viable alternative to present energy producing means.

An alternative film growth process is chemical spray deposition. Spray deposition is an inherently simple process requiring only a substrate heater and an atomizer. Spray deposition has been shown to be an efficient and economical means for large area thin film depositions. Chemical spray deposition has been demonstrated in diverse applications such as producing tin oxide or cadmium sulfide for example. Film growth is limited only by the requirement that the solution species decompose at the substrate to give the desired film. Deposition rates and film content are readily controlled by the degree of atomization and the solution content. Intentional film dopants, variant doping profiles, and other similar depositions specialties, available only in very complex vacuum deposition systems, are readily achieved by spray deposition. Furthermore, these parameters are achieved at a substantial cost savings over conventional vacuum techniques.

The present invention teaches a method for chemically spray depositing an oxide film of a metal or mixed metal. The oxide film is then heat treated in the presence of a chalcogen gas to produce a chalcogenide film useful in solar energy conversion devices.

PRIOR ART

Chemical spray deposition of oxide films are known in the art. For example, H. C. Hottel et al, in a technical publication entitled, "The Properties of A Copper Oxide-Aluminum Selective Black Surface Absorber of Solar Energy," Publication No. 71 of the Massachusetts Institute of Technology Solar Energy Conversion Project, teaches a method for spray depositing a layer of cupric oxide from a solution of cupric nitrate to produce black cupric oxide for solar absorbing surfaces. In contrast the present invention teaches the spray deposition of an essentially transparent oxide which is subsequently subjected to an annealing process to produce a selective absorbing surface.

Furthermore, unlike Hottel, the present invention uses a mixed solvent system comprising water and a water soluble hydrocarbon such as a low molecular weight hydrocarbon for example. The use of the mixed solvent system significantly alters the deposition of the oxide film. A concurrent decomposition of the hydrocarbon during the deposition process makes less oxygen available for metal oxide formation, resulting in the presently taught ability to control the stoichiometry of the oxide film.

In U.S. Pat. No. 3,840,389 there is taught a process for coating the outer and inner surfaces of a refractory oxide with a metal sulfide of ruthenium, platinum, rhodium or a combination thereof for use as a catalytic converter. The ruthenium and/or rhodium metal, deposited on and into the inner surfaces of the refractory oxide by solution impregnation, is annealed in the presence of hydrogen disulfide at a temperature between 15° C. and 95° C. to precipitate a corresponding metal sulfide. In contrast, the present invention teaches the method of producing ternary or higher order transition metal chalcogenides from the chalcogenide gas annealing of spray deposited intermediary oxide of a transition metal or mixed transition metals.

SUMMARY OF THE INVENTION

The present invention teaches a method of spray depositing metal or mixed metal oxide film having a predetermined oxidation state. A solution comprising a mixture of a salt of a metal or metals dissolved in a water soluble hydrocarbon and water solvent is spray deposited onto a heated substrate in an oxygen containing ambient. A predetermined hydrocarbon to water ratio dictates the resultant oxidation state of the spray deposited oxide film. The oxide film is subjected to a heat treatment in the presence of a chalcogen gas resulting in a thermally induced ion exchange whereupon the oxide film is transformed into a metal or mixed metal chalcogenide film, useful in solar energy conversion devices.

DETAILED DESCRIPTION OF THE INVENTION

In accordance with the present invention, oxides of metals such as iron, copper, zinc, cadmium, cobalt and nickel oxides or mixed metal oxides such as $CuFeO_2$, $5/2Cu_2O + 1/2Fe_2O_3$ and other similar mixtures of binary metal oxides will be spray deposited by thermal decomposition of salt solutions of said metals, such as metal nitrates, oxalates and acetates. The process is initiated by preparing a solution of said salt or salts in a mixed solvent of water and a water soluble hydrocarbon. A general preferance for nitrate salts over chloride salts has been evidenced from the optical quality and adherence of the resulting oxide films. A representative list of these nitrate salts include:

$Cu(NO_3)_2 \cdot 6H_2O$
$Fe(NO_3)_3 \cdot 9H_2O$
$Zn(NO_3)_2 \cdot 6H_2O$
$Co(NO_3)_2 \cdot 6H_2O$
$Cd(NO_3)_2 \cdot 4H_2O$
$Ni(NO_3)_2 \cdot 6H_2O$ The term adherence here denotes the ability of the film to withstand physical abrasion without substantial penetration through the film layer. Optical quality here includes the degree of transparency of the oxide film below its band edge absorption, the uniformity of coverage, and the film topology. Solution concentration has not been demonstrated to significantly affect the deposition of the metal oxide film, provided that other deposition parameters are suitably compensated. However, the deposition of mixed metals to form ternary or higher order metal oxide films has been shown to be concentration sensitive, requiring the confinement of solution concentration to the range of 0.005 molar to 0.01 molar to produce preferred oxide films of optimal adherence and optical quality. The terms ternary and higher order here refer to the number of elements present in the film. For example, a film of $CuFeO_2$ would be a ternary oxide film.

As mentioned heretofore, the solvent utilized in the present invention comprises a mixture of water and a water soluble hydrocarbon. Suitable water soluble hydrocarbons include methanol, ethanol and acetone for example, which for the purposes of the present invention, are mixed with an amount of water. In a preferred embodiment, a solvent mixture comprising 70% methanol by volume and water and having a solution molarity about equal to 0.01 molar produces an oxide film of optimal adherence and optical quality. Although 70% methanol by volume has been demonstrated as the preferred solvent, alternate solvents and solvent to hydrocarbon ratios may be used in the practice of the present invention. Suitable solvent mixture may include methanol and water mixtures ranging from about 50% methanol by volume to about 90% by volume, ethanol and water mixtures ranging from about 50% ethanol by volume to about 90% by volume and acetone of similar hydrocarbon to water mixture ratios. According to the teaching of the present invention, the nitrate salt in a mixed solvent solution is sprayed onto a heated substrate in an oxygen-containing ambient to form an oxide film. As mentioned previously, decomposition in the form of at least partial combustion of the hydrocarbon content of the spray solution occurs during the proximate to deposition of the oxide film. This results in a reduction in the amount of oxygen available in the oxygen-containing ambient for the formation of the metal oxide. Therefore, the stoichiometry of the metal-oxide film may be controlled by varying the hydrocarbon to water ratio of the spray solution. For example, in the formation of copper oxide films, utilizing water alone as a solvent results in films which consist of $CuO$ and $CuO_{0.67}$, whereas a mixture of 70% by volume methanol in water produced films which were less highly oxidized comprising $Cu_2O$ and $CuO$. As those knowledgeable in the art readily recognize, this permits the user of this invention to vary the semiconductor properties of the resultant film. That is to say, by varying the solvent's water to hydrocarbon ratio results in the growth of differing forms of the oxide film having differing semiconductor properties. In the foregoing example, for instance, $Cu_2O$ has a bandgap of 1.9 electron volts whereas $CuO_{0.67}$ has a bandgap of 2.35 electron volts.

A suitable substrate comprises any thermally conductive material capable of retaining its physical integrity at temperatures exceeding about 475° C. The selection of substrates is dictated by the intended use of the film. For instance, where the intended use of the final film is as in a photovoltaic device, the substrate may comprise an N or P type silicon wafer, whereupon contacting said silicon wafer with the chalcogenide film there forms a heterojunction, suitable for semi-conductor applications. Optically transparent substrates such as specialty glass, quartz, saphire or the like, may be employed in photovoltaic applications where illumination if intended through the substrate. For photovoltaic and other semi-conductor applications where a sandwich configuration is required, that is, where thin films are subsequently deposited covering a substantial part of the underlying layer, film continuity is of concern. The topology of the substrate must be essentially free from protrusions of the order of microns in size.

Photovoltaic and semi-conductor devices may be generally characterized as electronic applications of the present invention. These electronic applications are typically sensitive to the underlying substrate in terms of their electronic performance. In contrast, photothermal applications do not require film continuity on a submicron scale. The substrate need only satisfy thermal conduction and thermal integrity criteria. A representative list of substrate materials for both electronic applications and photothermal applications are referenced in Table I.

TABLE I

| SUBSTRATE | INTENDED FILM USE |
|---|---|
| Metals (Cu, Al) | Selective Absorbers |
| Glass | Electronic Devices |
| Quartz | Electronic Devices |
| Sapphire | Electronic Devices |
| n-Silicon | Heterostructures |
| p-Silicon | Heterostructures |

To insure thermal decomposition of the spray solution, the substrate temperature is maintained, as a minimum, at about 400° C. The measurement of this temperature, however, is at the substrate/heater interface. The actual film temperature during the deposition process will be proportionally lower. In a preferred embodiment, however, the substrate temperature is maintained at about 475° C. To accomplish this, there is required both a relatively high value of thermal conductance between the heat source and the surface of the substrate to be coated, and a sufficient thermal mass to sustain the substrate temperature throughout the thermal extraction experienced during the spray deposition process. This has been achieved by either floating the substrate in a molten metal maintained at the desired temperature, or, alternatively, using a vacuum chuck to hold the substrate in contact with the heat source during the spray process.

In the spray deposition of the liquid solution, a number of alternative conventional atomizing devices may be used. For example, ultrasonic, hydraulic, pneumatic, or vibrational atomizing devices may be used to provide a spray or mist of the liquid solution. It is particularly preferred in the practice of the present invention to use a pneumatic spraying device, in which the gas used to atomize the liquid solution is nitrogen. It should be appreciated, however, that other carrier gases, such as argon and the like, and even oxygen, may be employed. However, to ensure that the atomizing gas does not participate in the decomposition, an inert gas is preferred.

As is well-known, spray guns typically subdivide liquid solutions into droplets having diameters generally in the range of about 10 to 1,000 microns, whereas misting devices generate or subdivide liquid solutions into droplets having diameters in the range of about 0.1 to 100 microns. While the size of the droplets produced during atomization of the metal nitrate in the alcohol and water solvent has not been shown to be critical, it is desirable that the droplets be generally below 1,000 microns in diameter. As indicated above, conventional liquid spray devices will produce such an atomized stream of the liquid solution.

Using the described spraying, emperical data has demonstrated that a 0.005 to 0.01 molar solution sprayed at a rate of 10 cc's per minute and uniformly dispersed over a generally circular region of 6" diameter impinging on a substrate maintained at about 475° C., at a distance of 25 cm from the spray source, deposite a substantially adherent, virtually transparent oxide film about 1 micron thick in about 5 minutes. As should be readily appreciated, however, the time required for depositing a film of desired thickness will depend upon the concentration of the spray solution, the rate of atomization and the temperature of the substrate. Furthermore, this latter value, the substrate temperature, is also influenced by the growth of the oxide layer, since the oxide material is generally of a lower value in thermal conductance than that of the uncoated substrate.

Although films have been grown on a number of varied substrates having single crystal, polycrystalline and amorphous surfaces, substrates having an amorphous surface have been shown preferable to other substrate surfaces for consistently preparing an adherent oxide film. As will be shown in the forthcoming examples, the surface structure of the substrate will affect the crystallinity of the oxide film.

The spray deposited oxide film is subjected to a heat treatment comprising an annealing of the film at a temperature of between 300° C. and 350° C. in the presence of a chalcogen gas for a time sufficient to convert the oxide film to a chalcogenide film. Typical times range from 15 to 60 minutes. The oxide film undergoes a thermally induced ion exchange process transforming the oxide to the chalcogenide film. The chalocogen gas may additionally comprise a mixture or more than one chalcogen. For example, the annealing gas may contain both sulfur and selenium which will produce a dichalcogenide film.

In a preferred embodiment, the chalcogen gas is diluted with an inert carrier gas such as nitrogen which constitutes greater than about 90% of the total gas by volume. The film is annealed at a temperature of about 325° C. for a period of about 30 minutes.

Furthermore, thermodynamic calculations have led the inventor to the belief that the present technique extends to the deposition of the following ions as suitable chalcogen substitutes in the practice of the present invention: phosphorous, arsenic, antimony. It is also believed that metals of groups VIB, VIIB, VIII, IIB, IB, i.e. of the periodic table found within the Handbook of Chemistry by J. J. Perry, including Tl, Sn, Pb, Bi, In, and Ga are suitable cation substitutes for the transition metals in the formation of oxide and mixed oxide films.

A better understanding of the present invention may be appreciated from the following examples, which set forth in detail the preparation and evaluation of representative films produced in accordance with the present invention.

EXAMPLE 1

A spray solution of 0.01 molar copper nitrate in solution with 70% by volume methanol in water was prepared and loaded into a liquid feed chamber of a Binks pneumatic spray nozzle (Model No. 50-175). The spray feed system was modified to provide monitoring of the liquid flow rate. The fluid feed rate was pre-adjusted to 10 cc/min. The pneumatic pressurization was provided by compressed air at 5 psi, monitored by conventional metering equipment.

A Corning Type 7059 glass substrate was floated in a solder pot containing molten tin. The temperature of the tin was maintained at about 475° C. The distance from the nozzle to the substrate surface was 25 cm. The initial spray was shielded from the substrate by mechanical shuttering means until the spray flow visually appeared uniformly dispersed over the area to be covered. Total deposition time from opening the shutter and exposing the substrate to the spray stream, to shutter reclosing was 300 seconds. During this time, the monitored temperature of the substrate varied from 475° C. to 450° C. The substrate was removed from the heater. A portion of the oxide film was set aside for evaluative testing and the remainder of the film sample was placed into a tube furnace. The temperature of the tube furnace was maintained at 325° C. Flowing gaseous hydrogen disulfide diluted in nitrogen at a ratio of about 6/94 maintained a positive pressure atmosphere within the tube. The film was annealed for approximately 30 minutes, after which the film was allowed to cool and then removed for testing.

The film was subjected to X-ray diffraction analysis which indicated the presence of $Cu_{1.8}S$, $Cu_{1.75}S$ and $Cu_{1.96}S$. An ESCA (Electron Spectroscopy for Chemical Analysis) analysis of the intermediary oxide film indicated that the film included two phases of copper oxide, CuO and $Cu_2O$.

EXAMPLE 2

Example 2 is virtually identical in oxide film preparation as Example 1, except that ferric nitrate is substituted for the copper nitrate. In this example, it is believed that the conversion of the iron oxide film to the iron sulfide film required a preliminary change in the oxidation state of the iron oxide and formation of the disulfide molecular ion in $(S_2)^{-2}$, expressible as:

$$Fe_2O_3 + 4H_2S \rightarrow 2FeS_2 + H_2 + 3H_2O$$

The iron sulfide film was similarly subjected to X-ray diffraction, which verified film composition as $FeS_2$. The intermediary oxide film was verified as comprising $Fe_2O_3$ by ESCA analysis (*Electron Spectroscopy for Chemical Analysis*). Optical absorption measurements, performed in a Cary Model 17 Spectrometer, indicated an optical band gap of 0.89 electron volts for the iron sulfide film, which is in close agreement with values reported, for example, those values reported by A. Schlegel and P. Wachter Journal of Physics, Part C, Solid State Physics, Vol. 9, P 3363, 1976.

EXAMPLE 3

Example 3 is virtually identical to Example 2, except that copper-iron nitrate of the form $Cu^{+2} + Fe^{+3}$ was substituted for the ferrous nitrate of Example 2. The intermediary oxide film was subjected to X-ray and ESCA (Electron Spectroscopy for Chemical Analysis) analysis, and was determined to comprise CuO, $Cu_2O$ and $Fe_2O_3$. The end product sulfide film, according to X-ray analysis, comprised the chalcopyrite $CuFeS_2$. Optical absorption measurement indicated an optical band gap of 0.68 electron volts, also in confirmity with reported standards.

EXAMPLE 4

Example 4 is virtually identical to Example 2 in oxide preparation, except that copper-iron nitrate, $[5Cu^{+2}+Fe^{+3}]$ is substituted for the ferrous nitrate of Example 2. X-ray diffraction analysis indicated the composition of the film to be bornite ($Cu_5FeS_4$).

EXAMPLE 5

Example 5 is identical to Example 3, except that an n-type silicon wafer was used as a substrate. The copper iron sulfide formed a heterojunction to the silicon substrate and silver paint electrodes were attached to allow electrical measurements. An examination of the diode characteristics of the device (Current-Voltage Curves) confirmed the formation of a heterojunction between the silicon and sulfide layers. The film was then irradiated with monocromatic light of controllably variable frequency while monitoring the current produced by the photovoltaic device. A curve generated by varying the wavelength and monitoring the current (typically referred to as an action spectra) verified photovoltaic response from wavelengths 1250 nm to 350 nm.

EXAMPLE 6

Example 6 is similar to Example 2, except that a polished copper metal substrate is substituted for the glass substrate of the earlier described example. The oxide films grown on the metal substrate demonstrated selective absorption of light below about 1 micron. Optical measurements indicated an integrated solar absorption coefficient $\alpha$, about equal to 0.90 and an integrated emissivity, $\epsilon$, about equal to 0.49 measured at 100° C.

What is claimed is:

1. A method for producing metal or mixed metal chalcogenide films comprising:
   providing a substrate for depositing said film thereupon;
   heating said substrate to a temperature between about 400° C. and 500° C.;
   providing a solution of at least one salt of a metal selected from the group consisting of iron copper, nickel, cobalt, cadmium, zinc, molybdenum, or mixtures thereof in a mixture of water and a water soluble hydrocarbon;
   atomizing said solution;
   contacting said heated substrate with said atomized solution in an oxygen containing ambient to form an adherent film comprising an oxide of said metal or metals;
   annealing said oxide film at a temperature from about 300° C. to about 400° C. in the presence of a gaseous chalcogen comprising sulfur, selenium, tellurium, or a mixture thereof, capable of undergoing an ion exchange with said oxide film, for a period sufficient to form an adherent film of a chalcogenide compound of said metal or metals.

2. A method for producing metal or mixed metal chalcogenide films comprising:
   providing a substrate for depositing said film thereupon;
   heating said substrate to a temperature between about 400° C. and 500° C.;
   providing a solution of at least one salt of a metal selected from the group consisting of iron, copper, nickel, cobalt, cadmium, zinc, molybdenum, or mixtures thereof in a mixture of water and a water soluble hydrocarbon;
   atomizing said solution;
   contacting said heated substrate with said atomized solution in an oxygen containing ambient to form an adherent film comprising an oxide of said metal or metals;
   annealing said oxide film at a temperature from about 300° C. to about 400° C. in the presence of a protonated gaseous chalcogenide of selenium, tellurium, sulfur or a mixture thereof capable of undergoing an ion exchange with said oxide film, for a time sufficient to form an adherent film of a chalcogenide compound of said metal or metals.

3. The method set forth in claims 1 or 2 wherein said substrate is maintained at about 475° C.

4. The method set forth in claims 1 or 2 wherein said annealing time ranges from about 15 minutes to about 60 minutes.

5. The method set forth in claims 1 or 2 wherein said substrate comprises a metal.

6. The method set forth in claim 5 wherein said substrate is aluminum.

7. The method set forth in claims 1 or 2 wherein said substrate comprises silicon.

8. The method set forth in claims 1 or 2 wherein said substrate comprises glass.

9. The method set forth in claims 1 or 2 wherein said mixture of water and a water soluble hydrocarbon is further characterized as having a hydrocarbon to water ratio from about 90% hydrocarbon, 10% water, to about 50% hydrocarbon, 50% water.

10. The method set forth in claim 9 wherein said water soluble hydrocarbon comprises methanol, ethanol, acetone or a mixture thereof.

11. The method set forth in claims 1 or 2 wherein said mixtures comprises 70% methanol by volume.

12. The method set forth in claims 1 or 2 wherein said contacting is continued for a time sufficient to deposit an oxide film no more than about 10 microns in thickness.

13. The method set forth in claims 1 or 2 wherein said contacting continues for about 5 minutes to deposit an oxide film which is about 1 micron in thickness.

14. The method set forth in claims 1 or 2 wherein said metal salt is a nitrate salt.

15. The method set forth in claim 14 wherein said nitrate salt is selected from $Cu(NO_3)_2$, $Fe(NO_3)_2$ or mixtures thereof.

16. The method set forth in claim 2 wherein said protenated gaseous chalcogenide comprises hydrogen sulfide, hydrogen selenide, hydrogen telluride or mixtures thereof.

17. The method set forth in claims 1 or 2 wherein said solution is further characterized as having a molarity of between about 0.005 to 0.010 molar.

18. The method set forth in claims 1 or 2 wherein said solution is further characterized as having a molarity of about 0.010 molar.

19. A method for producing a selective absorbing surface for efficiently converting sunlight energy into heat energy, said method comprising:
   providing a reflective, thermally conducting substrate for depositing said selective absorbing surface thereupon;
   heating said substrate to a temperature from about 400° C. to about 500° C.;
   providing a solution of a nitrate salt of at least one metal selected from iron, copper, cadmium, zinc and nickel dissolved in a mixture of methanol and water;

atomizing said solution;

contacting said heated substrate with said atomized solution in an oxygen containing ambient to form an adherent film comprising an oxide of said metal or metals;

annealing said oxide film at a temperature of about 325° C. for a period of about 30 minutes in the presence of a protonated gaseous chalcogenide of selenium, tellurium, sulfur, or a mixture thereof whereby said oxide film undergoes an ion exchange with said chalcogenide to form an adherent film of a chalcogenide compound of said metal or metals.

20. A method for producing a heterojunction photovoltaic device comprising:

providing an N-type silicon substrate;

heating said substrate to a temperature from about 400° C. to about 500° C.;

providing a solution of a nitrate salt or iron and of copper in a mixture of methanol and water;

atomizing said solution;

contacting said heated substrate with said atomized solution in an oxygen containing ambient for a period of about 5 minutes to form an adherent film comprising an oxide of copper and iron;

annealing said oxide film in a gaseous mixture of hydrogen disulfide and nitrogen to form an adherent film comprising $Cu_5FeS_4$ whereby a heterojunction is formed between said N-type silicon and said copper iron sulfide.

* * * * *